US006234877B1

(12) United States Patent
Koos et al.

(10) Patent No.: US 6,234,877 B1
(45) Date of Patent: *May 22, 2001

(54) METHOD OF CHEMICAL MECHANICAL POLISHING

(75) Inventors: Daniel A. Koos, Tempe, AZ (US); Sung C. Kim, Pflugerville, TX (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/590,035

(22) Filed: Jun. 7, 2000

Related U.S. Application Data

(63) Continuation of application No. 09/351,424, filed on Jul. 12, 1999, now Pat. No. 6,120,354, which is a continuation of application No. 08/871,028, filed on Jun. 9, 1997, now Pat. No. 5,934,980.

(51) Int. Cl.$^7$ ........................................................ B24B 1/00
(52) U.S. Cl. ........................................ 451/41; 451/60
(58) Field of Search ............................. 451/41, 60, 28, 451/36, 37, 65, 285, 287; 216/88, 89, 95; 438/692, 693; 156/636.1, 645.1, 655.1, 656.1

(56) References Cited

U.S. PATENT DOCUMENTS

| | | | |
|---|---|---|---|
| 4,549,374 | 10/1985 | Basi et al. ........................ 51/283 R |
| 4,956,313 | 9/1990 | Cote et al. ........................ 437/203 |
| 4,968,381 | 11/1990 | Prigge et al. .................... 156/636 |
| 4,992,135 | 2/1991 | Doan ................................ 156/636 |
| 5,169,491 | 12/1992 | Doan ................................ 156/636 |
| 5,216,843 | 6/1993 | Breivogel et al. ............... 51/131.1 |
| 5,340,370 | * 8/1994 | Cadien et al. .................... 51/308 |
| 5,407,526 | 4/1995 | Danielson et al. ............... 156/636 |
| 5,478,435 | 12/1995 | Murphy et al. .................. 216/89 |
| 5,516,346 | 5/1996 | Cadien et al. .................... 216/89 |
| 5,540,810 | 7/1996 | Sandhu et al. .................. 156/636.1 |
| 5,643,406 | 7/1997 | Shimomura et al. ............ 438/693 |
| 5,693,239 | 12/1997 | Wang et al. ..................... 216/88 |
| 5,700,383 | 12/1997 | Feller et al. .................... 216/89 |
| 5,934,980 | * 8/1999 | Koos et al. ...................... 451/41 |
| 6,120,354 | * 9/2000 | Koos et al. ...................... 451/41 |

OTHER PUBLICATIONS

"Application of Chemical Mechanical Polishing to the Fabrication of VLSI Circuit Interconnections" J. Electrochem. Soc., vol. 138 No. 6, Jun. 1991 pp. 1778–1783.

\* cited by examiner

Primary Examiner—Derris H. Banks
(74) Attorney, Agent, or Firm—Walter D. Fields

(57) ABSTRACT

A method of planarizing a substrate employs two separate chemical mechanical polishing (CMP) steps. In the first CMP step, the substrate is polished using a first CMP slurry solution and a polishing pad. A diluting solution is then applied to the polishing pad to remove slurry of the first CMP step. In the second CMP step, after applying the diluting solution to the polishing pad to remove the first slurry, second CMP slurry solution is applied to the polishing pad to facilitate additional planarization of the substrate. In a particular embodiment of this invention, the diluting solution comprises a buffer solution having a pH level corresponding to a pH level of one of the first or second CMP slurry solution. In accordance with another aspect of this embodiment, a plurality of different diluting solutions are applied to the polishing pad intermediate the respective first and second CMP steps.

8 Claims, 4 Drawing Sheets

METHOD OF CHEMICAL MECHANICAL POLISHING

This a continuation of U.S. application Ser. No. 09/351,424, filed on Jul. 12, 1999, now U.S. Pat. No. 6,120,354 issued Sep. 19, 2000; which is a continuation of U.S. application Ser. No. 08/871,028, filed on Jun. 9, 1997, now U.S. Pat. No. 5,934,980 issued Aug. 10, 1999.

BACKGROUND OF THE INVENTION

The present invention relates generally to planarization of a substrate; and more particularly relates to chemical mechanical polishing (CMP) of a semiconductor substrate employing two separate chemical mechanical slurry solutions.

During fabrication of certain semiconductor devices, a metal layer, e.g., tungsten or aluminum may be deposited upon an underlying patterned dielectric layer, e.g., phosphosilicate glass (PSG), borosilicate glass (BSG), borophosphosilicate glass (BPSG) or silicon dioxide ($SiO_2$), to form interconnects, for example, within a semiconductor. In forming the interconnects, chemical mechanical polishing of the metal layer removes metal material until reaching the dielectric. Ideally, the polished substrate has a flat surface, leaving metal in voids of the patterned dielectric to serve as interconnect plugs. These interconnects should each have a flat upper surface that is flush with an upper plane defined by the top surfaces of the patterned dielectric layer. When a subsequent metal layer is deposited, the deposited metal electrically connects with ends of the plugs. The interconnect plugs, therefore, provide electrical connections between the upper metal to respective semiconductor regions therebelow.

Available CMP procedures for planarizing a metal layer relative to a patterned dielectric for the formation of an interconnect plug often result in undesirable divits, surface unevenness, or salt residues. Assuming a known planarization procedure employing two separate CMP slurry solutions, it is theorized (pursuant this disclosure), that the addition of a second CMP slurry solution to a polishing procedure while first CMP slurry solution is still present, may alter a pH of the polishing procedure. This change in pH level, in-turn, may effect formation of precipitates, causing the slurry solution to gel and/or provide salt formations.

Furthermore, when injecting different slurry solutions onto a polishing pad at different times during polishing of a semiconductor substrate, the pH of the combined solutions is not precisely controlled; rather, the pH level is in a state of fluctuation as the new slurry solution is dispensed onto the pad and mixed with solutions already on the pad. Thus, the resulting CMP process rate and selectivity are not precisely known. For example, the slurries of certain known CMP processes for polishing tungsten have been found to chemically attack the tungsten layer and create undesirable voids within exposed tungsten plugs, or result in the formation of vias during later process stages. Additionally, if there is a loss of oxide selectivity (for the above described example where the oxide layer serves as the patterned dielectric beneath the tungsten), the lack of oxide selectively may result in complete removal of certain oxide portions so as to expose and damage underlying semiconductor devices beneath the oxide layer-resulting in scrapped material.

SUMMARY OF THE INVENTION

The chemical etch rate of certain materials is strongly dependent on a pH level of the associated slurry solution. Accordingly, the present invention provides new methods for polishing of a substrate, which methods provide greater control of the pH level during the planarization procedures.

During a polishing procedure, a second slurry solution is dispensed onto a polishing pad following use of a first slurry solution, providing a slurry solution transition to alter characteristics of polishing of a semiconductor substrate. The second slurry solution may have a pH that is different from the first solution. Since the polishing pad used for polishing the substrate has a capacity to absorb slurry, a precise switch from one pH to another pH during the polishing of the substrate is not readily available. In accordance with one embodiment of the present invention, a diluting solution is dispensed onto the polishing pad as an intermediate step between the application of respective first and second slurry solutions to the polishing pad. The diluting solution assists neutralization of the polishing pad before the application of the second slurry solution.

In accordance with one aspect of this particular embodiment of the present invention, a substrate is polished using a first slurry solution and a polishing pad. Thereafter, the first slurry solution is substantially removed from the polishing pad using at least one diluting solution. After this step of applying diluting solution to the polishing pad to remove the first slurry solutions, the substrate is further polished using a second slurry solution.

In a preferred aspect of this embodiment of the present invention, the first slurry solution is removed from the polishing pad using (as the diluting solution) a first buffer solution having a pH to the same side of 7 as that of the first slurry solution. Following use of the first buffer solution, a solvent is applied to the polishing pad for neutralizing a pH level. Preferably, the buffer solution and/or solvent are applied to the polishing pad during relative movement of the substrate against the polishing pad and during mechanical conditioning of the polishing pad.

BRIEF DESCRIPTION OF THE DRAWINGS

The present invention will be understood from reading the following description of particular embodiments, with reference to the attached drawings as listed below, where.

DETAILED DESCRIPTION OF THE PREFERRED EMBODIMENTS

Figure 1:
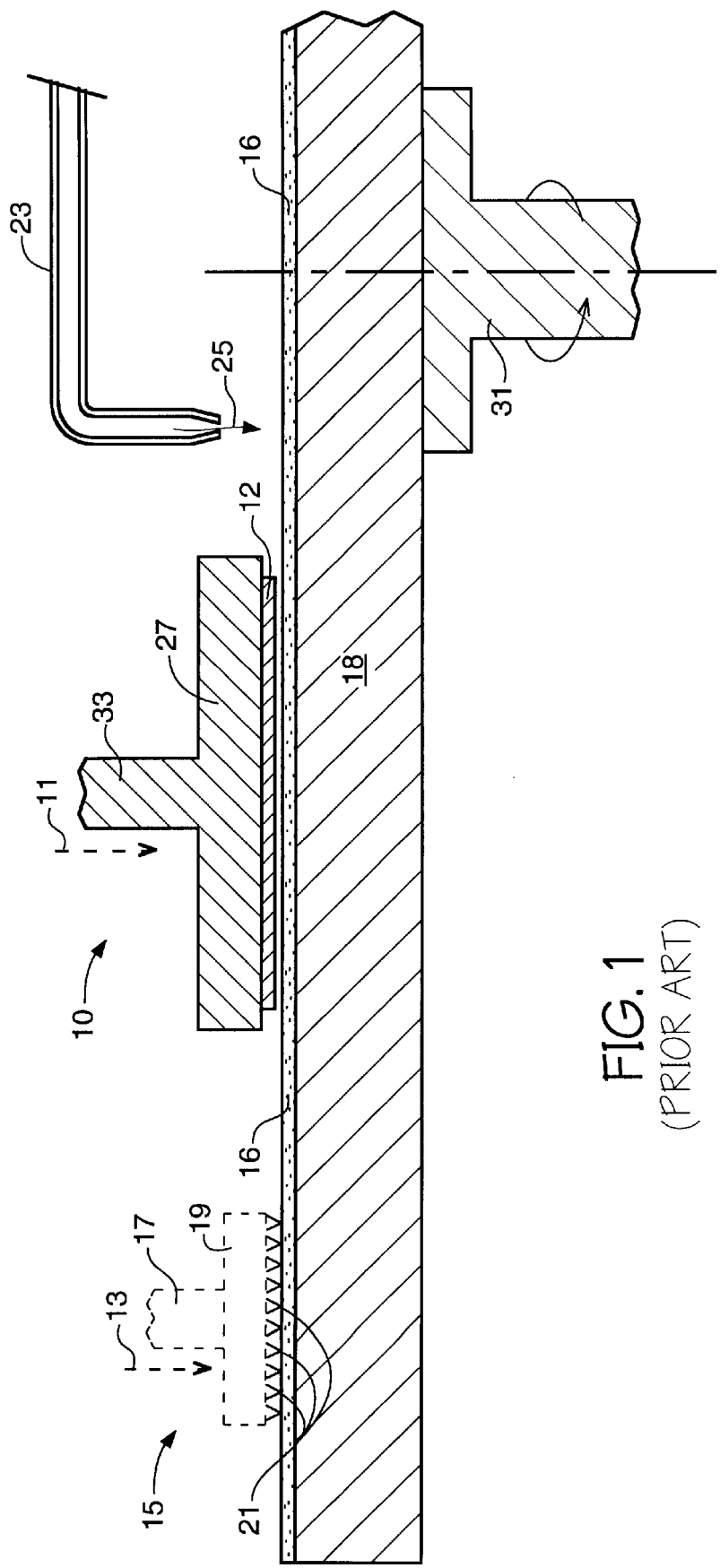
FIG. 1 is a partial, cross sectional, simplified view representative of a chemical mechanical polishing (CMP) machine for polishing a substrate.
Figure 2:
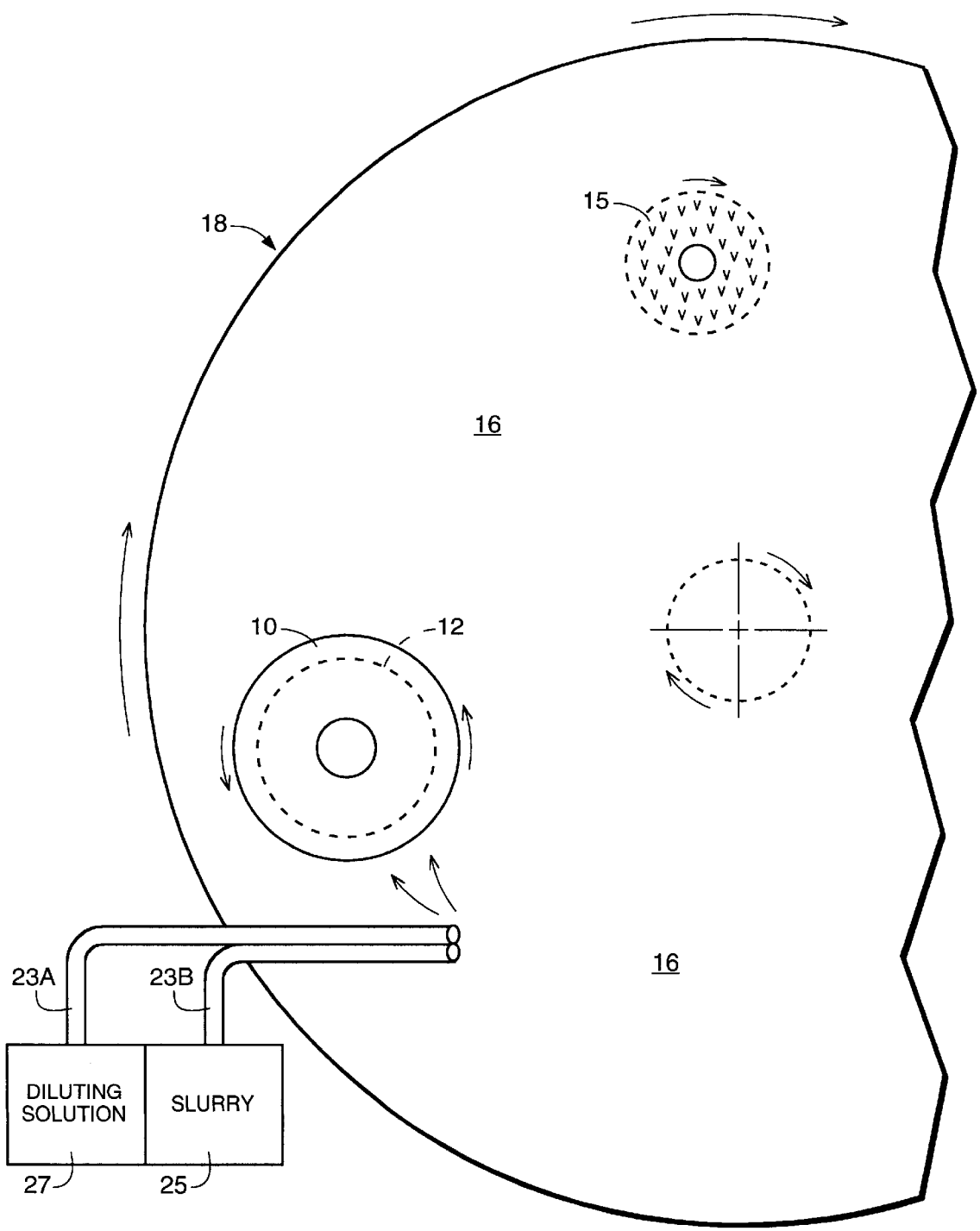
FIG. 2 is a partial, simplified block diagram view representative of the CMP polishing apparatus of FIG. 1 for polishing a substrate.

With reference to FIGS. 1 and 2, a chemical mechanical polishing (CMP) apparatus includes a polishing table 18 coupled to a table shaft 31 for holding and rotating a polishing pad 16 on an upper surface of the polishing table 18. Wafer carrier 10 has a polishing head 27 coupled to an associated shaft 33. Polishing head 27 has a lower surface for seating substrate 12 in face-to-face relationship with a polishing surface of polishing pad 16. Shaft 33 of wafer carrier 10 can be rotated or moved using known means for moving a surface of substrate 12 relative polishing pad 16. In addition, a downward force 11 is typically applied to wafer carrier 10 for pressing the surface of substrate 12 against the polishing surface of polishing pad 16.

Although not shown specifically, polishing head 27 of wafer carrier 10 preferably has a slight recess for receiving substrate 12 therein. During polishing, fluids provide an adhesive force between substrate 12 and polishing head 27 for keeping substrate 12 adhered to polishing head 27 by way of the surface-tension effects therebetween. Although, the polishing head, in a preferred embodiment, has a recess for seating substrate 12; polishing head 27 alternatively employs other known substrate adhesive provisions. By way of example, polishing head may comprise an intermediate poromeric material consisting of a fiber reinforced polyurethane foam as described in U.S. Pat. No. 3,841,031, issued Oct. 15, 1974, to Robert J. Walsh, entitled "Process for Polishing Thin Elements", the disclosure of which is hereby incorporated by reference in its entirety.

Preferably, wafer carrier 10 can be moved radially in or out relative the center of polishing table 18. Additionally, head shaft 33 is capable of being rotated at the same time that table shaft 31 of the polishing table 18 is rotated, as shown by the respective arrows of FIG. 2 of the present application, and includes provisions to apply force to a substrate for gently holding the substrate under pressure against a polishing head during rotation and/or oscillation of head shaft 33 and rotation (or oscillation) of polishing table 18.

Solution delivery tube or pipe 23 (with reference to FIGS. 1 and 2) has an ejection outlet, or nozzle, positioned over the polishing surface of polishing pad 16 for enabling delivery of various solutions to the surface of polishing pad 16. FIG. 1 shows only one solution delivery tube 23 over the polishing table 18; however, it will be understood that a plurality of solution delivery tubes 23 (as shown in FIG. 2) could be provided for delivering one or a plurality of associated solutions to the polishing surface of polishing pad 16. Such a multiple solution delivery system is described in U.S. Pat. No. 5,540,810, issued Jul. 30, 1996, to Gurtej Sandhu et al, entitled "IC Chemical Mechanical Planarization Process Incorporating Two Slurry Compositions for Faster Material Removal Times", the disclosure of which is hereby incorporated by reference in its entirety.

With reference to FIG. 2, solution delivery tube 23A has one end disposed over the polishing pad 16 for dispensing a diluting solution as received from a reservoir 27. Similarly, solution delivery tube 23B has one end disposed over the polishing pad 16 proximate the outlet of delivery tube 23A to deliver, for example, a slurry solution from an associated reservoir 25. Not shown, although implied, are appropriate pumps and valve regulators for controlling flows of slurry solution and diluting solution through respective solution delivery tubes 23 onto the polishing surface of polishing pad 16. Additionally, it will be understood that the solution supplied to respective delivery tubes 23 may be altered in known fashion using a control valve in selective communication between separate supply reservoirs of different solutions. Additionally, although not shown, solution delivery tube(s) 23, is (are) mounted to an appropriate control arm that provides variably controlled positioning of the outlet(s) of tube(s) relative the polishing surface of polishing pad 16.

An additional optional element for the CMP polishing apparatus, as shown in phantom-lines in FIGS. 1 and 2, is mechanical conditioner unit 15. Face plate 19 of mechanical conditioner 15 has conditioner tips 21 on a lower surface thereof for meeting the polishing surface of polishing pad 16. During conditioning, conditioner tips 21 penetrate the polishing pad 16 to a depth established in accordance with a height of the conditioner tips 21, the height of the tips being established relative to a bottom horizontal surface of face plate 19. The bottom horizontal surface of face plate 19 acts as a mechanical-stop, keeping the conditioner tips 21 at a preferred penetration depth. During mechanical conditioning of the polishing pad 16, polishing table 18 is rotated while conditioner tips 21 of the conditioner 15 are held against the polishing surface of polishing pad 16. Additionally, shaft 17 of the mechanical conditioner 15 is rotated, and moved radially relative polishing table 18 so as to facilitate complete coverage and conditioning of polishing pad 16.

CMP machines are available from companies such as Strausbaugh or Itec/Westech. Exemplary CMP polishing pads are available from companies such as Rodel, Dupont or Clarino. In one preferred embodiment and implementation of the invention, the CMP polishing pad for performing the process of the present invention is an IC-1000 Rodel polishing pad, configured in a pad stack arrangement (not shown) with an FR-4 underpad also of Rodel. Although specific CMP machines, polishing pads, and substrate mounting techniques have been disclosed for carrying out CMP procedures of the present invention, it is to be understood that the methods and techniques of the present invention may be carried out similarly using alternative CMP machines, polishing pads, substrate mounting and/or mechanical conditioning tools.

During polishing of a surface of a substrate 12, the surface of substrate 12 is held against a polishing surface of polishing pad 16 and moved relative thereto while chemical mechanical polishing (CMP) slurry mixtures are dispensed and applied to the surface of polishing pad 16 for facilitating planarization of substrate 12. During the polishing procedure, the rotational movement of polishing pad 16 will cause slurry solution to flow radially outward. Some of the slurry solution will flow off polishing pad 16 due to the centrifugal forces of the rotation. Accordingly, in order to keep an adequate amount of slurry on the polishing pad during polishing, solution is typically supplied to polishing pad 16 continually during the CMP operation.

As used hereinafter, diluting solution refers to a diluent used to wash away material from the polishing pad, i.e., a liquid applied to the polishing pad for cleansing the polishing surface. The diluting solution in one exemplary embodiment comprises a buffer solution, or alternatively, simply a solvent. A buffer solution refers to a known solution comprising both a weak acid and weak base and having the ability to absorb small additions of acids and bases without giving rise to a significant change in the pH of the solution. A known solvent generally refers to a liquid capable of dissolving or dispersing other substances, typically the substance of greatest proportion in a solution is deemed the solvent. However, in solutions that contain water, water is typically deemed the solvent.

In certain polishing procedures, it is desirable to employ a first slurry solution during a preliminary polishing step (for removing, for example, a first layer of material from the substrate 12) followed by a subsequent polishing step that employs a different slurry solution. During the second polishing procedure, for example, a subsequent amount of the material is removed from the substrate.

Figure 3:
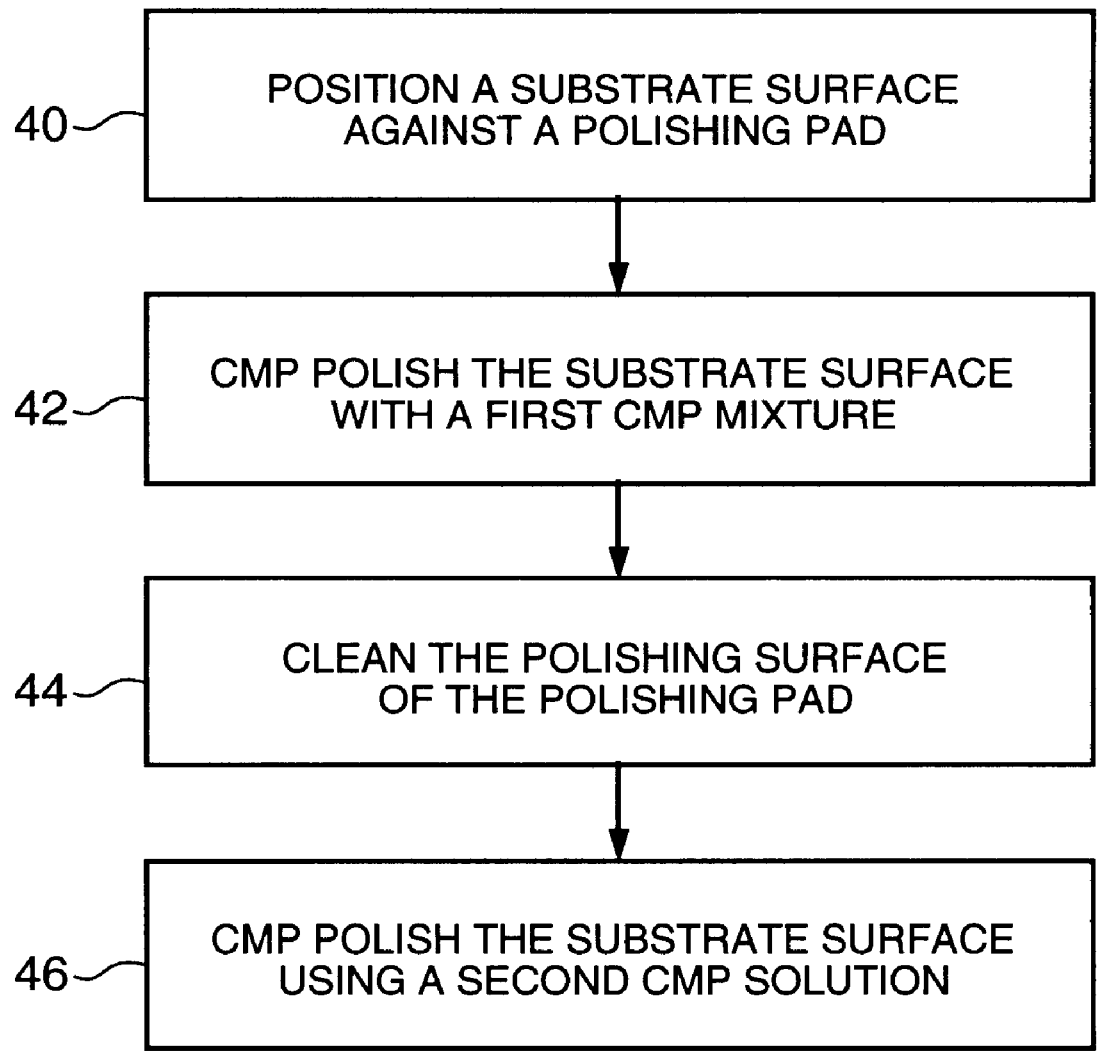
FIG. 3 is a simplified flow chart representative of a CMP procedure of the present invention.
Figure 4:
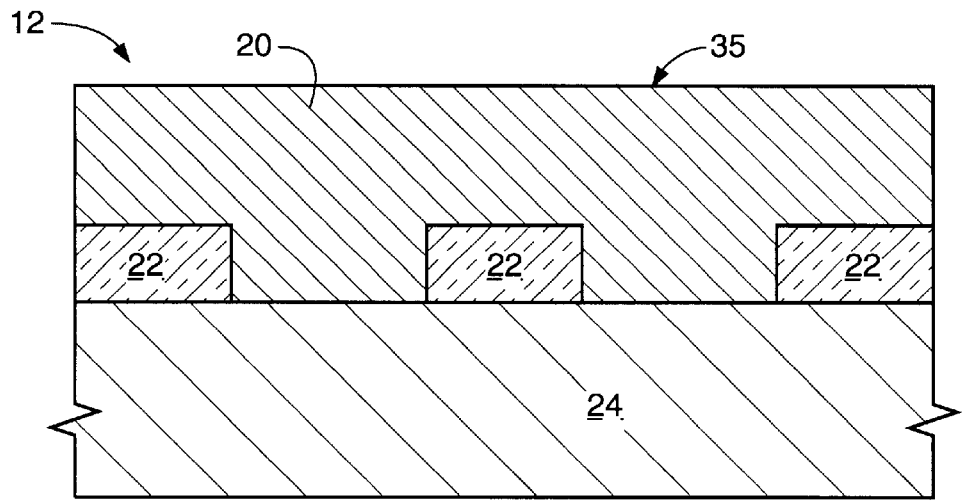
FIGS. 4–6 are cross sectional views of an exemplary substrate for illustrating various stages of a CMP procedure of the present invention.
Figure 5:
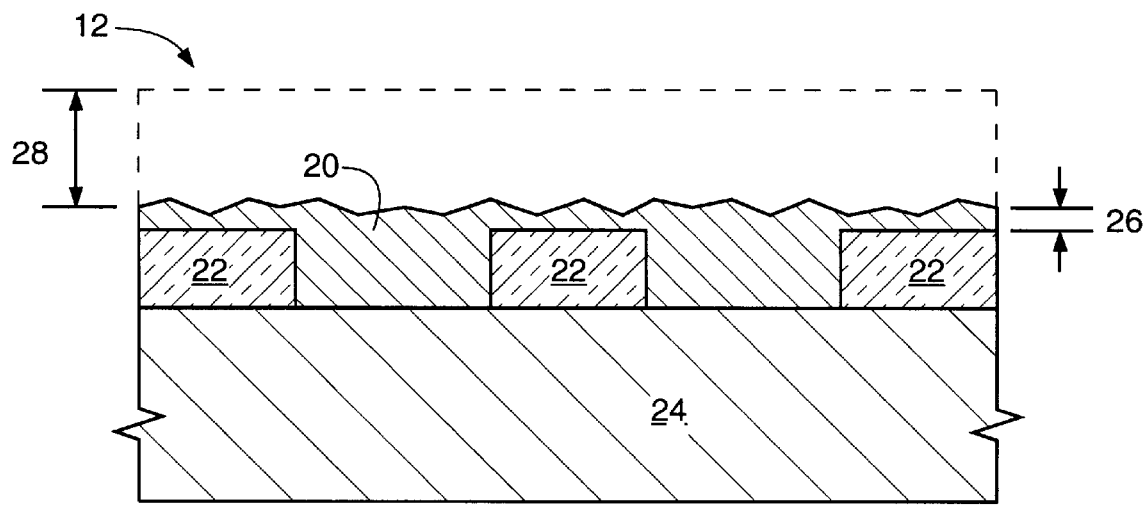
Figure 6:
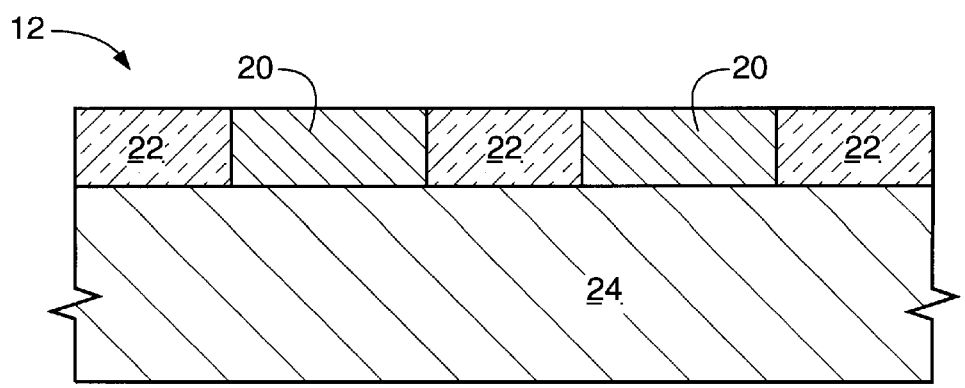

For purposes of illustration, with reference to FIGS. 4–6, a preliminary portion 28 of material 20 (e.g. tungsten) is removed from substrate 12 by way of a first polishing procedure. Thereafter, a subsequent portion 26 of material 20 is removed using a second slurry solution until achieving a desired planar arrangement of material 20 relative secondary material 22, for example, tungsten relative a dielectric. During the first polishing step for the removal of the first portion 28 of material 20, it may be desirable to employ a first chemical-mechanical polishing (CMP) slurry mixture for providing an efficient first removal rate for removal of material 20. Thereafter, the remaining polishing planarization step could employ a different slurry solution that provides a reduced etching characteristic for etching of material 20 relative material 22. In such circumstances, the first CMP polishing step may employ an acidic CMP slurry solution while the subsequent polishing procedure may employ a basic CMP slurry solution. When transitioning between the different slurry mixtures, the subsequent slurry solution has typically been dispensed and applied to the polishing surface of polishing pad 16 with residual remnants of the first slurry solution still present thereon. Accordingly, when the acidic solution, of the first polishing step, for example, meets a basic solution of, for example, the second polishing step, it is theorized (pursuant this disclosure) that unwanted precipitates result. Such precipitates, e.g., a salt, can have an adverse impact upon the desired polishing of substrate 12. Accordingly, the present invention proposes an intermediate step of applying a diluting solution to a polishing surface of a polishing pad intermediate the two separate polishing steps of a multiple step polishing procedure. With reference to FIG. 3, the diluting solution is applied (step 44) to the polishing pad intermediate a transition from a first slurry solution to a second slurry solution.

The simplified flow chart of FIG. 3 outlines a chemical-mechanical polishing procedure of the present invention, which is described herein with reference to the exemplary substrate depicted in FIGS. 4–5. With reference to FIG. 4, substrate 12 has been previously processed to define first 22 and second 20 layers of material over a base substrate 24. In the exemplary embodiment, base structure 24 comprises a silicon wafer. In alternative embodiments, base substrate 24 comprises other materials such as gallium arsenide, aluminum oxide, glass, ceramic, or other similar substrate material. In addition, although not shown, it will be understood that base substrate 24 may be representative of a previously processed substrate, upon which layers 22 and 20 are provided thereover. In one preferred embodiment of the present invention, materials 22 and 20 comprise a dielectric material and a metal respectively. More particularly, dielectric 22 is a silicon based insulator such as silicon dioxide, or alternatively, phosphosilicate glass (PSG), borophosphosilicate glass (BSPG) or silicon nitride; and metal 20 is tungsten, or alternatively, aluminum, titanium, or titanium nitride. Alternatively, substrate 12 constitutes a base substrate alone (e.g., silicon, gallium arsenic, aluminum oxide, glass, ceramic) that is to be processed by the procedure of the present invention, after which additional materials will be layered thereover.

In a preliminary step, substrate 12 is secured to the polishing head 27 of wafer carrier 10. In step 40, the exposed surface 31 of substrate 12 (facing away from polishing head 27) is positioned for meeting the polishing surface of polishing pad 16.

In step 42, a first CMP polishing solution is applied to the surface of polishing pad 16 while an appropriate force and respective rotational motions are applied to wafer carrier 10 and polishing table 18 to facilitate planarization of surface 35 of substrate 12. The CMP polishing of step 42, using the first CMP slurry solution, continues until a majority 28 of layer 20 (e.g. tungsten) is removed from substrate 12, as shown in FIG. 5. In a preferred embodiment of the present invention, the first CMP slurry mixture is an acidic pH (pH greater than 7) slurry with alumina particles and provides efficient removal of tungsten. Such CMP slurry solutions are available from Rodel, Inc, under the trademarks of MSW-1000 or MSW-2000.

After removing the first portion 28 of substrate 12 via the first CMP polishing step 42, a diluting solution is applied to the polishing surface of polishing pad 16 for clearing residual slurry (of the first CMP step) from the polishing surface of polishing pad 16. In a preferred embodiment of the present invention, pad conditioner 15 scrubs the polishing surface of polishing pad 16 while the diluting solution is dispensed onto the polishing pad 16. In accordance with one aspect of this preferred embodiment, the rotation of wafer carrier 10 and polishing table 18 continue during the cleaning step, enabling removal of residual slurry from substrate 12 and polishing head 27 at the same time. In alternative embodiments of the present invention, wafer carrier 10 lifts substrate 12 from the polishing pad during the pad cleaning procedure; and/or pad conditioner 15 is not used at all, during the time that the diluting solution is dispensed upon the polishing pad.

As the diluting solution is applied to polishing pad 16, it is preferably applied, firstly, near the center of the polishing pad. Thereafter, outlet 25 of solution delivery tube 23 is moved radially outward away from the center of the pad, in order to dispense diluting solution upon other circumferential regions of polishing pad 16. A known mechanical arm is operative to control the position of the solution dispensing tube 23 relative the polishing table so as to move outlet 25 of the tube along the radial direction away from the center of the polishing table during the polishing pad cleaning step 44. Additionally, and regardless of the movement of delivery tube 23, as diluting solution is applied to the polishing surface of polishing pad 16, rotation of polishing table 18 provides rotational centrifugal forces to flow diluting solution (as dispensed thereon) along the surface and radially outward from the center of polishing pad 16 so as to carry-away residual slurry from polishing pad 16.

Preferably, the diluting solution is dispensed from delivery tube 23 by way of a nozzle with sufficient velocity to agitate and loosen slurry materials on the polishing surface when the diluting solution strikes the surface of the polishing pad. This fluid scrubbing action assists cleansing of polishing pad 16.

In one embodiment of the present invention, the diluting solution comprises a buffer solution having a pH level the same side of 7 as that of the first CMP slurry mixture. In other words, if the CMP slurry solution has an acidic pH level, the diluting solution used is a buffer solution of acidic pH; likewise, if the CMP slurry solution has a basic pH level, the diluting solution used is a buffer solution of basic pH. More preferably, the buffer solution has a pH level within two of that of the first CMP slurry solution and prevents precipitates from forming on the polishing pad when the buffer solution mixes with the residual CMP slurry (e.g., of the first CMP procedure).

An exemplary basic buffer solution to be used in connection with a basic slurry, comprises 1–5 weight percent ammonium hydroxide and 0.5–2 weight percent ammonium acetate in water providing a pH of about 8–10 pH.

In one embodiment and implementation of the present invention, the above exemplary buffer solution is used as a diluting solution to cleanse a polishing pad of previous SC-20 (KOH buffered) slurry, or ILD-1300 (ammonium hydroxide buffered) slurry.

An exemplary acidic buffer solution to be used in connection with an acidic slurry, comprises about 20 parts by volume of ammonium fluoride solution (80 weight percent in water) and 1 part hydrofluoric acid (49 weight percent in water) providing a pH of about 4–5.

In another embodiment and implementation of the present inventions, the above exemplary buffer solution is used as a diluting solution to cleanse a polishing pad of previous acidic pH slurry, e.g., MSW-1000 or MSW-2000.

Buffer solution, as the diluting solution, is applied to the polishing pad at a rate and duration to sufficiently clean the pad of first CMP solution. In an exemplary procedure of this embodiment, polishing pad 16 has a diameter of about 20–100 inches and a rotational speed of about 10–70 rpm, and preferably receives buffer solution for a duration in the range of 5 to 120 seconds, and most preferably in the range, from 20 to 30 seconds. The rate at which the buffer solution is applied to the polishing pad, in this preferred embodiment, is in the range of 50 milliliters to 1 liter per minute, or more preferably 100 to 300 milliliters per minute. In a specific exemplary embodiment of the present invention, the buffer solution is dispensed at a rate of 200 milliliters per minute. Of course, the amount of time that the buffer solution is applied to the polishing pad can be adjusted in accordance with the size of the polishing pad, the amount of solution dispensed per unit time, the rotational speed of the polishing pad and cleanliness desired.

After cleaning the polishing surface of polishing pad 16 (per step 44), additional polishing of the substrate is provided in step 46 using a second CMP slurry solution. In the exemplary embodiment of the present invention, remaining portion 26 of substrate 12 is removed using a second CMP slurry solution having basic pH. Preferably, the second CMP slurry solution comprises either a potassium hydroxide or ammonium hydroxide buffer based slurry with silica suspended therein for assisting oxide removal. Such slurry solutions are available from Rodel, Inc.—i.e., tradename SC-20 for a silica based potassium hydroxide buffered slurry, or tradename ILD-1300 for a silica based ammonium hydroxide buffered slurry. By sufficiently removing first slurry solution from polishing pad 16 (e.g., using the associated diluting solution) before applying the second CMP slurry, precipitation of unwanted particulate is minimized.

In one particular embodiment of the present invention, a single buffer solution (serving as the diluting solution) is dispensed over polishing pad 16 during cleaning step 44. Such a procedure can be used when the first CMP slurry mixture of step 42 and the second CMP slurry mixture of step 46 have comparable chemistries, e.g., both acidic or both basic or, alternatively, with pH levels within two of each other. In such case, the buffer solution serves to re-establish the pad's pH condition, to purge the pad of slurry accumulation or build-up, and to assist conditioning of the polishing pad.

On the other hand, if the pH level of the first slurry solution differs substantially from the pH level of the second slurry solution, for example, one is acidic and the other basic or, alternatively, the pH levels differ from each other by more than two, then undesirable precipitates could be formed if the two different solutions are combined on the polishing pad, as might occur during a transition from the first slurry to second slurry solution. Therefore, in accordance with one preferred embodiment of the present invention, the polishing surface of polishing pad 16 is first neutralized before dispensing the second CMP slurry solution onto the polishing pad.

In accordance with this one embodiment of the present invention, assuming first and second CMP slurry solutions of substantially different pH chemistries, two separate diluting solutions are applied, at different time intervals, to the polishing surface of the polishing pad, intermediate the application of the respective first and second CMP slurry solutions. After polishing substrate 12 using the first CMP slurry solution of, for example, acidic pH (i.e. after completing step 42), a buffer solution of (acidic) pH is applied to the polishing surface of the polishing pad 16. The buffer solution serves as a first diluting solution for washing away particulate and residual material of the first CMP procedure. Thereafter, a second diluting solution is applied to the polishing surface of polishing pad 16 for purging the polishing pad 16 of the first diluting solution and for neutralizing the associated pH. Preferably, the second diluting solution comprises a solvent, such as, for example deionized water. Alternatively, the solvent comprises other suitable pH neutral solutions, such as, for example, acetone or alcohol. Again, as similarly described hereinbefore, preferably, the pH neutralization solution or solvent is dispensed by way of a nozzle onto the polishing pad 16 with sufficient velocity so as to agitate and loosen particles and liquids as it impinges the surface and assist cleansing of previous diluting solution and/or slurry off of the polishing pad. Pad conditioner 15 and wafer carrier 10 each may or may not be operative for conditioning polishing pad 16 and polishing substrate 12 respectively during the application of the second diluting solution. Once polishing pad 16 has been neutralized by the appropriate neutralization solution, the second CMP slurry mixture is dispensed onto polishing pad 16 with reduced concern of undesirable precipitates or salt formation.

In accordance with an additional, alternative aspect of this embodiment of the present invention, step 44 further comprises an additional step of applying a third diluting solution to polishing pad 16 following the previous applications of first and second diluting solutions. The third diluting solution is provided a pH level that is comparable with the second CMP slurry mixture. In certain procedures, residual diluting solution on polishing pad 16 may result in undesirable precipitation of materials when the second CMP slurry mixture is combined therewith. Accordingly, this alternative procedure preconditions polishing pad 16 with a solution having a pH level comparable with the pH of the second CMP slurry mixture.

In other words, if the second CMP slurry solution is acidic, then the third diluting solution is a buffer solution of acidic pH; if the second CMP slurry solution is basic then the third diluting solution is a buffer solution of basic pH. Accordingly, the third diluting solution comprises a buffer solution with a pH level the same side of seven as that of the second CMP slurry mixture, and more preferably, within two of the pH of the second CMP slurry mixture. This buffer solution is applied to polishing pad 16 for a duration sufficient to purge the polishing surface of previous solutions. Again, wafer carrier 10 and pad conditioner 15 may or may not be operable (but preferably, they are both operative) during the application of this third solution to polishing pad 16. After polishing pad 16 has been preconditioned with the third diluting solution, the second CMP slurry solution is applied to the polishing pad 16 to provide additional chemical mechanical polishing of substrate 12.

Thus, according to the polishing procedures of the present invention, a substrate is polished using two different slurry solutions while avoiding undesirable precipitation and/or salt formations.

In the exemplary embodiments of the present invention described above, the first CMP slurry solution was described as having an acidic pH while the second CMP slurry solution was characterized with a basic pH. It will be understood that the present invention similarly encompasses other CMP slurry sequences of different pH levels. Such alternative slurry sequences would employ respective buffer solutions of similar pH levels corresponding thereto. For example, it may be desirable to first etch an oxide layer over a metal layer, wherein the first CMP slurry solution could have a basic pH and the second CMP slurry solution an acidic pH. When employing three separate diluting solutions intermediate the slurry transition, the first diluting solution comprises a buffer solution having a basic pH level that corresponds to the pH level of the first CMP slurry solution; the second diluting solution comprises an intermediate pH level solution (e.g., a neutral solvent); and the third diluting solution comprises a buffer solution having an acidic pH level that corresponds to the acidic pH of the second CMP slurry solution.

Likewise, although the CMP polishing procedures of the exemplary embodiments described above were described for planarizing a metal over a dielectric; it is understood that the scope of the present invention could similarly encompass planarization of one particular dielectric material relative a second type of dielectric material. For example, doped glass could be planarized relative undoped glass, silicon oxide relative silicon nitride, or gallium-arsenide relative aluminum-gallium-arsenide. Similarly, the CMP polishing procedure of the present invention encompasses polishing of one electrically conductive material relative a second electrically conductive material—for example, aluminum relative tungsten, tungsten relative titanium nitride, or copper relative silicon. During such polishing operations, CMP slurry transitions need not be limited to acid-base pH transitions. For these particular alternative applications, it may be desirable to shift from, for example, a strong acidic to a less acidic CMP slurry mixture. In addition, a slurry transition may comprise a switch from a silica based CMP slurry solution to an alumina based CMP slurry solution.

In each of the above embodiments, an intermediate diluting solution is dispensed onto the polishing pad, intermediate a slurry transition, so as to purge previous solutions off of the polishing pad. This intermediate step offers advantages such as providing better control of pH levels on the polishing pad and reducing undesirable artifacts associated with mixing of different CMP slurry solutions.

It should be readily understood that the embodiments described and illustrated herein are illustrative only, and are not to be considered as limitations upon the scope of the present invention. Other variations and modifications may be made in accordance with the spirit and scope of the present invention.

What is claimed is:

1. A method of chemically-mechanically planarizing a substrate, comprising:
   positioning said substrate against a polishing pad;
   supplying first slurry to said polishing pad;
   planarizing said substrate with said polishing pad and said first slurry;
   supplying a buffer solution and a diluting solution to said polishing pad to cleanse said polishing pad of at least a portion of said first slurry;
   supplying second slurry to said polishing pad; and
   further planarizing said substrate with said polishing pad and said second slurry.

2. A method of polishing a substrate, comprising:
   positioning said substrate against a polishing surface;
   polishing said substrate with said polishing surface and a first polishing solution;
   after at least a portion of said polishing, using a buffer solution to at least partially cleanse said polishing surface; and
   further polishing said substrate with said polishing surface and a second polishing solution, said second polishing solution different from said first polishing solution;
   at least one of said polishing and said further polishing comprising mechanical planarization.

3. A method according to claim 2, wherein said at least one of said polishing and said further polishing comprises chemical-mechanical planarization.

4. A method according to claim 2, wherein said at least one of said first polishing solution and said second polishing solution comprises a slurry mixture having mechanical particles suspended therein.

5. A method according to claim 2, further comprising providing one of an acidic or basic pH for said first polishing solution, and the other one of said acidic or basic pH for said second polishing solution.

6. A method of polishing a substrate, comprising:
   positioning said substrate against a polishing surface;
   polishing said substrate with said polishing surface and a first polishing solution;
   moving said substrate relative and against said polishing surface and using a buffer solution to at least partially cleanse said polishing surface during at least a portion of said moving; and
   further polishing said substrate with said polishing surface and a second polishing solution, said second polishing solution different from said first polishing solution.

7. A method of planarizing a substrate having at least one layer of material, said method comprising:
   polishing the substrate using a polishing surface and a first planarization mixture to remove a first portion of said one layer;
   using a diluting solution to cleanse the polishing surface of at least a portion of said first planarization mixture while moving said substrate relative and against said polishing surface during the cleansing thereof with said diluting solution; and
   further polishing the substrate using the polishing surface and a second planarization mixture to remove a second portion of said one layer.

8. A method according to claim 7, further comprising providing a buffer solution as said diluting solution.

* * * * *